United States Patent [19]
Henry

[11] Patent Number: 4,528,683
[45] Date of Patent: Jul. 9, 1985

[54] CIRCUIT FOR STORING A MULTI-DIGIT DECIMAL NUMERICAL VALUE OF THE DISTANCE TRAVERSED BY A VEHICLE

[75] Inventor: Peter Henry, Mühlheim, Fed. Rep. of Germany

[73] Assignee: VDO Adolf Schindling AG, Frankfurt am Main, Fed. Rep. of Germany

[21] Appl. No.: 381,674

[22] Filed: May 25, 1982

[30] Foreign Application Priority Data
Jun. 15, 1981 [DE] Fed. Rep. of Germany ....... 3123654

[51] Int. Cl.³ ............................................... G01B 7/02
[52] U.S. Cl. ...................................... 377/24; 377/26; 377/34
[58] Field of Search .................... 377/24, 34, 109, 112, 377/20; 365/185, 183

[56] References Cited
U.S. PATENT DOCUMENTS

| 3,456,200 | 7/1969 | Bos ..................................... 377/109 |
| 3,684,870 | 8/1972 | Nelson ............................... 377/112 |
| 3,916,390 | 10/1975 | Chang et al. ...................... 365/183 |
| 3,984,815 | 10/1976 | Drexler et al. ..................... 377/20 |
| 4,263,664 | 4/1981 | Owen et al. ........................ 365/185 |

OTHER PUBLICATIONS

IBM Technical Disclosure Bulletin, vol. 23, No. 2, Jul. 1980, pp. 460–462, Modified Gray Code Counters, by Barrs et al.

Primary Examiner—John S. Heyman
Assistant Examiner—K. Ohralik
Attorney, Agent, or Firm—Martin A. Farber

[57] ABSTRACT

A circuit for storing a multi-digit decimal numerical value of the distance traversed by a vehicle having a signal transmitter which gives off electric counting pulses, and particularly an electronic tachometer. The improvement consists of the numerical value being able to be stored by means for coding the numerical value in a one-step code for a non-volatile storage formed of floating-gate storage cells.

8 Claims, 5 Drawing Figures

| $Q_4$ | $Q_3$ | $Q_2$ | $Q_1$ | $Q_0$ | Z |
|---|---|---|---|---|---|
| L | L | L | L | L | 0 |
| L | L | L | L | 0 | 1 |
| L | L | L | 0 | 0 | 2 |
| L | L | 0 | 0 | 0 | 3 |
| L | 0 | 0 | 0 | 0 | 4 |
| 0 | 0 | 0 | 0 | 0 | 5 |
| 0 | 0 | 0 | 0 | L | 6 |
| 0 | 0 | 0 | L | L | 7 |
| 0 | 0 | L | L | L | 8 |
| 0 | L | L | L | L | 9 |

FIG.4

| n \ K | 0 | 1 | 2 | 3 | 4 | 5 |
|---|---|---|---|---|---|---|
| 0 | 0 | 1 | 2 | 3 | 4 | 5 |
| 1 | 1 | 2 | 3 | 4 | 0 | 5 |
| 2 | 2 | 3 | 4 | 0 | 1 | 5 |
| 3 | 3 | 4 | 0 | 1 | 2 | 5 |
| 4 | 4 | 0 | 1 | 2 | 3 | 5 |

FIG.5

CIRCUIT FOR STORING A MULTI-DIGIT DECIMAL NUMERICAL VALUE OF THE DISTANCE TRAVERSED BY A VEHICLE

The invention relates to a circuit for storing a multi-digit decimal numerical value of the distance traversed by a vehicle having a signal transmitter which gives off electric counting pulses, and particularly an electronic tachometer.

Electronic tachometers in which a galvanometer, rather than an eddy current tachnometer, is used to indicate the speed are already known. In order to form the signal corresponding to the speed, electric pulses are used which are produced by a signal generator which measures the output speed of rotation of the transmission. The electronic pulses from the signal generator are fed into a signal processing circuit. The circuit comprises essentially an electronic evaluation unit developed with an integrated circuit which contains, in the direction of flow of the signal, a pulse shaping Schmitt trigger and a monovibrator which gives off a pulse of constant width and so controls a source of constant current that the mean value of the constant current given off by the source of constant current is a measure of the frequency of the electric pulse of the signal generator, which frequency is indicated by the galvanometer. The electronic evaluation unit furthermore comprises a frequency converter which is also fed by the monovibrator and which, via a driver, acts on a stepping motor in order to drive a mechanical disc-type counter which indicates the distance travelled. Between the counter and the stepping motor there is ordinarily arranged a matching transmission which takes the actual speed of travel into consideration. Finally, the electronic evaluation unit can have a digital output for feeding a speed governor, a speed alarm or a service monitoring device.

This electronic tachometer makes it possible, it is true, to get along without a mechanical drive shaft and thus avoid premature wear, noise and fluttering indications by the drive shaft. Nevertheless, this electronic tachometer is imperfect due to the traditional indication of the distance travelled, i.e. odometer indication. In particular, due to the stepping motor with matching transmission which is required for the indication of the distance travelled and the counter, a reduction in structural volume as compared with traditional eddy-current tachometers is not possible. The disc counter mechanism driven by the stepping motor can produce undesired noises. For the person who views the disc counting mechanism when installed in the car, no difference can be noted—aside from the said disturbances—from the disc counting mechanisms of traditional eddy current tachometers.

For the above reasons the goal was set, for the development of electronic tachometers using modern electronic indicating means, particularly liquid crystal cells, for the indication of the distance traveled. These indicating means, however, presuppose a continuous storing of the multi-digit decimal numerical value to be displayed since electromechanical storage with the traditional stepping motor, matching transmission, and mechanical disc counter mechanism is to be eliminated.

For demonstration purposes the attempt has already been made to store the distance traveled by a C-MOS-RAM write-read memory in combination with a battery. In this connection, however, the disadvantages are noted, among other things, that a battery may not have sufficient storage capacity over the temperature range of $-25°$ C. to $+70°$ C. which occurs in automobiles. Furthermore, suitable batteries, for instance lithium batteries, are expensive.

The object of the invention is therefore to create—while avoiding the disadvantages of previous odometers or distance storage devices—using semiconductor technology, a storage circuit which has a storage life of at least ten years with operating voltage disconnected over a wide operating temperature range of from $-25°$ C. to $+70°$ C. and whose storage charge time or erasure time is sufficiently short to store the changing numerical value. The circuit should furthermore make it possible, at least in the long run, to reduce the cost of manufacturing the storage and the storage indication.

This object is achieved in accordance with the invention in the manner that the numerical value can be stored by means for coding the numerical value (for instance counters D0, D1, D2, D3, D4, D5) in a single-step code in a non-volatile storage (for instance 21, 22) formed of floating-gate storage cells.

With this circuit, which has a non-volatile storage consisting of floating-gate storage cells, a storage life of more than ten years is obtained with an ambient temperature of 70° C. The operating temperature range of $-25°$ C. to $+70°$ C. is maintained. The logic for the control of the storage can be arranged in advantageous manner on the same chip as the storage cells. The storage charge time, i.e. the time for writing a logical 1 (L) is independent of the number of write-erase cycles and typically remains less than 20 ms. The time for erasing the storage depends on the number of erase cycles and after 10,000 erase processes it is typically about 100 ms. In accordance with the invention, in order to keep the number of erase cycles as small as possible and thus keep the erase time short, the numerical value is stored in a one-step code in the non-volatile storage. In this way, upon passage from one multi-digit numerical value to the next higher multi-digit numerical value, only one place will change its value from a first binary state, for instance 1, to a second binary state, for instance 0.

For this purpose the means for coding the numerical value are preferably developed in the Libaw-Craig code.

As a non-volatile storage formed of floating-gate storage cells a non-volatile RAM manufactured by SGS-Ates can advantageously be used, for example.

In detail furthermore, the circuit of the invention is developed in the manner that, as means for coding there is provided a multi-decade counter (for instance D0 ... D5) in which each decade for the counting of the numerical value is developed in the one-step code, and that one group each of floating-gate storage cells can be addressed for the storage of one coded numerical value corresponding to each decade (A0,A1 ... A5 in FIG. 3).

With this circuit, therefore, the counting process or formation of the numerical value in the one-step code is separated from the storage of the numerical value, and the numerical values are formed and stored in decade fashion. During a counting cycle which passes through the entire supply of numbers of a decade each counting bit changes only once from the first binary state 1 to the second binary state 0. Thus during a counting cycle in all storage cells which associated with a decade can be reached under one address, only a single erase cycle takes place during each counting cycle. The erase time is therefore kept small.

With the customary organization of a multi-decade counter and storage, a lower decade will, upon incrementation, change the values of its positions more frequently than the positions of the next higher decade will change. In order therefore to permit the erase times for the storage cells of the lower decade to increase as little as possible during the storage time of the non-volatile storage, means (coder 23) which are actuated at predetermined numerical values are provided for cyclically interchanging the addresses of the storage places ($A_0, A_1 \ldots A_5$) of the lowest decades ($D_0, D_1, D_2, D_3, D_4$).

In this way the associating of the decades of the counter with those of the storage places changes at predetermined numerical values, customarily every 100,000 km.

In detail, for the transfer of the numerical value from the counter into the non-volatile storage, the circuit, with due consideration of the above inventive principles, is developed in the manner that each of the counter outputs (20) of the lowest five decades ($D_0$ to $D_4$) can be cyclically connected, via a decade selector developed as multiplexer, with the storage inputs each of which can be addressed with a single address; that an address counter (29) which counts successive decades is provided, it controlling the decade selector (30) as well as a first input of a coder (23) whose second input is fed by at least one decade (6th decade, $D_5$) of the counter; and that an address output (bus line) of the coder is present for cyclically interchanging the addresses of the lowest five decades with the storage (storage part 21).

In this circuit therefore the numerical value is transferred in advantageous fashion by decades—preferably commencing with the highest decade—in multiplex operation into the non-volatile storage. In this connection, depending on the numerical value reached (typically every 100,000 km), the association of the lowest five decades of the counter with the five corresponding addresses of the non-volatile storage is cyclically interchanged. The association of the highest sixth decade of the counter with the address of the non-volatile storage of the sixth decade remains unchanged. The address counter, in addition to controlling the decade selector, controls the coder which furthermore is provided for the lowest five decades every 100,000 km as a function of the counting value, for the cyclic interchange of the addresses in the non-volatile storage. This circuit can be produced on a chip, thus saving space.

In order to make certain that in case of change in the battery voltage, and particularly a failure of voltage, the storage unit will not be destroyed, a buffer capacitor is provided in the circuit in order to secure the data in case of the failure of the operating voltage during a writing process which is transferring the counter reading into the storage.

The buffer capacitor supplies enough energy that the transfer of the numerical value from the counter into the non-volatile storage is concluded even if the operating voltage fails during a transfer cycle.

The circuit is provided with the data securing means particularly advantageously in the manner that each address ($A_0$, $A_1$ to $A_5$) of the non-volatile storage (21, 22) is increased by an additional bit (sixth storage cell); that a control logic (control logic part 28 and 1-bit register F), controlled by an operating voltage monitoring device, is so constructed that in case of a failure of operating voltage during the transfer of the reading of the counter into the non-volatile storage (21, 22), the writing process under one address of a decade is carried out to the end by means of the buffer capacitor; thereupon the additional bit is added to this decade. Upon the next following connection of the operating voltage, the contents of the addresses of the lower decades are set at a predetermined number (zero).

With this development of the means for securing the data, the capacity of the buffer capacitor can be very small, since in the event of a failure of operating voltage during a writing process, only the writing process for the decade being transferred at the time is carried out to the end, and the failure of operating voltage is then marked by the entry of a given binary state into the sixth bit of the address being acted on at the time. Since the storage cell belonging to this sixth bit is provided only for this special case, it can be written rapidly. The counter value can be restored again after restoration of the operating voltage, since the additional sixth bit was placed at a predetermined binary state, typically 1, only if the content of the decade belonging to this address had just changed. This means that the counter has just counted a transfer into this decade so that the lower decades have the value of zero, to which value the addresses are set after restoration of the operating voltage. If the numerical value has not been changed since the last transfer cycle before the failure of the operating voltage, no additional bit of a decade will be marked since the old numerical value is very rapidly written over into the non-volatile storage.

With the above and other objects and advantages in view, the present invention will become more clearly understood from the following detailed description of preferred embodiments read in conjunction with the accompanying drawings, in which:

FIG. 4 shows the counting code, and

FIG. 5 is a function table of the addresses for the storage places for the individual decades as a function of predetermined counting intervals (every 100,000 km).

Figure 1:
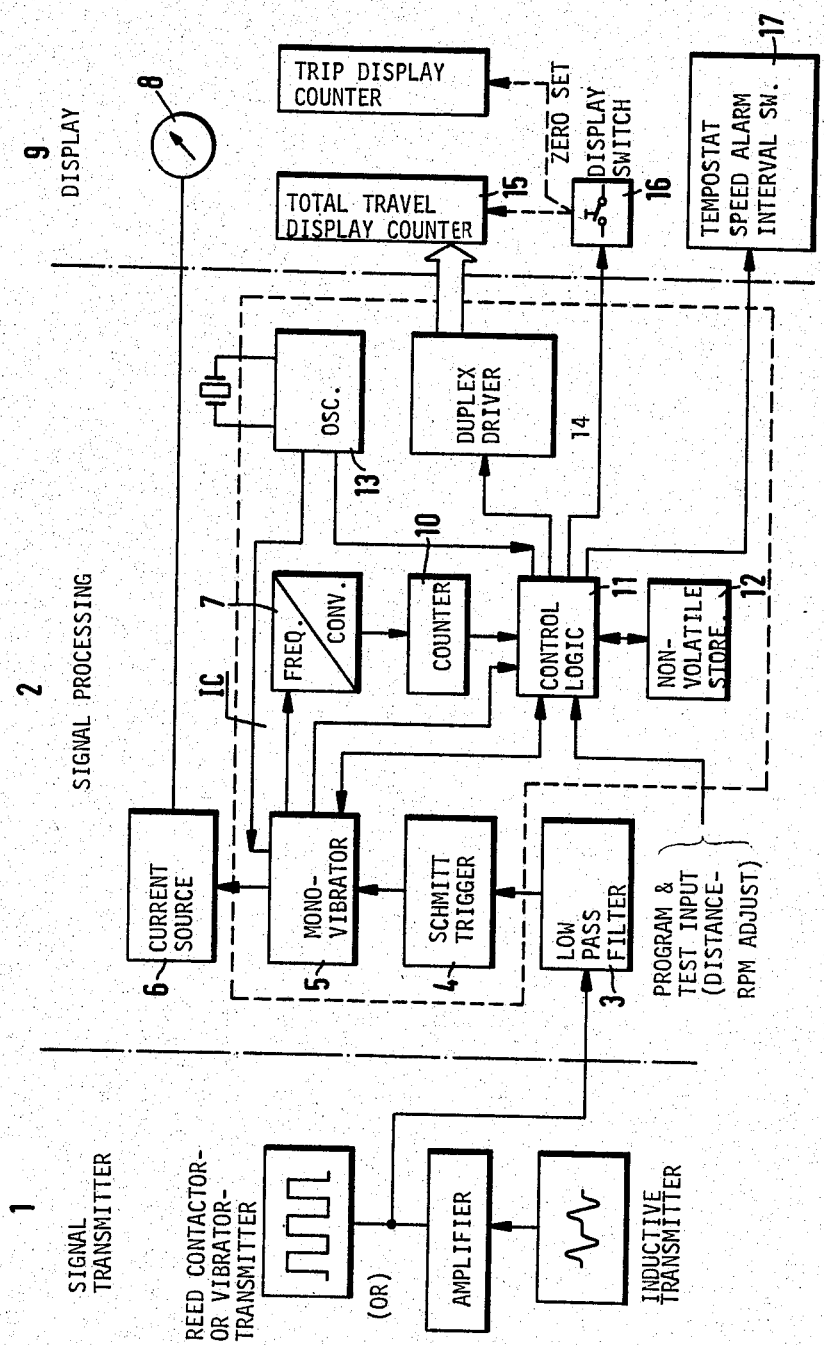
FIG. 1 is a block diagram of an electric tachometer with distance indication based on liquid crystals and with a non-volatile storage.

In the block diagram of FIG. 1, there is indicated in section 1 the signal transmitter which can be developed as a reed contactor or as oscillator transmitter, or else as an inductive transmitter with amplifier connected behind it. Adjoining the signal transmitter there is a circuit 2 for the processing of the signal. It is formed essentially on a semiconductor chip. From a low-pass filter 3 which receives the electric counting pulses from the signal transmitter a Schmitt trigger 4 on the semiconductor chip is actuated so that predetermined shaped pulses act on a monovibrator 5 (a monostable multivibrator) on the semiconductor chip. The monovibrator produces pulses of constant pulse width which on the one hand control a source of constant current 6—not on the semiconductor chip—as well as a frequency converter 7 on the semiconductor chip. The source of constant current acts on a galvanometer 8 as speed indication in a group 9 for the display of the signal.

The frequency converter 7 feeds a counter 10 whose counter reading is to be stored via a control logic 11 in a controlled manner in a non-volatile storage 12. Counter 10, control logic 11 and non-volatile storage 12 are also components of the integrated circuit, as well as an oscillator 13 and a clock and a driver stage 14 which are acted on by the control logic.

The driver stage 14 acts on a kilometer display 15 which represents the numerical value stored in the non-volatile storage 12, as an indication of the kilometers traveled by the vehicle. The kilometer reading can be switched by a display switch 16 from a total reading to a trip reading.

Furthermore, a speed governor, a speed alarm or an interval switch 17 corresponding to the speed travelled or the distance traversed can also be controlled by the control logic 11.

Figure 2:
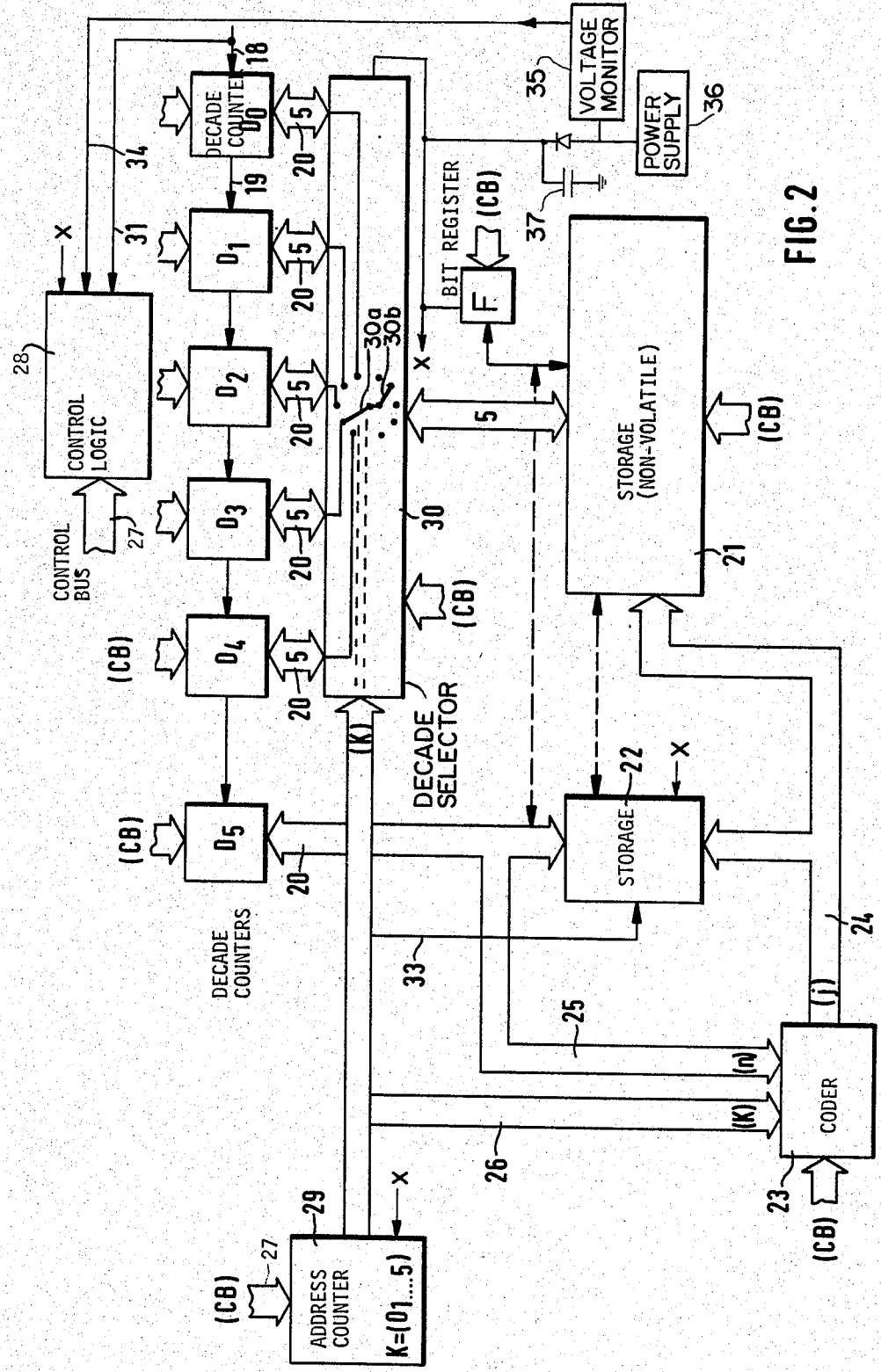
FIG. 2 is a block diagram of the non-volatile storage with the corresponding counter and the corresponding control logic.
Figure 3:
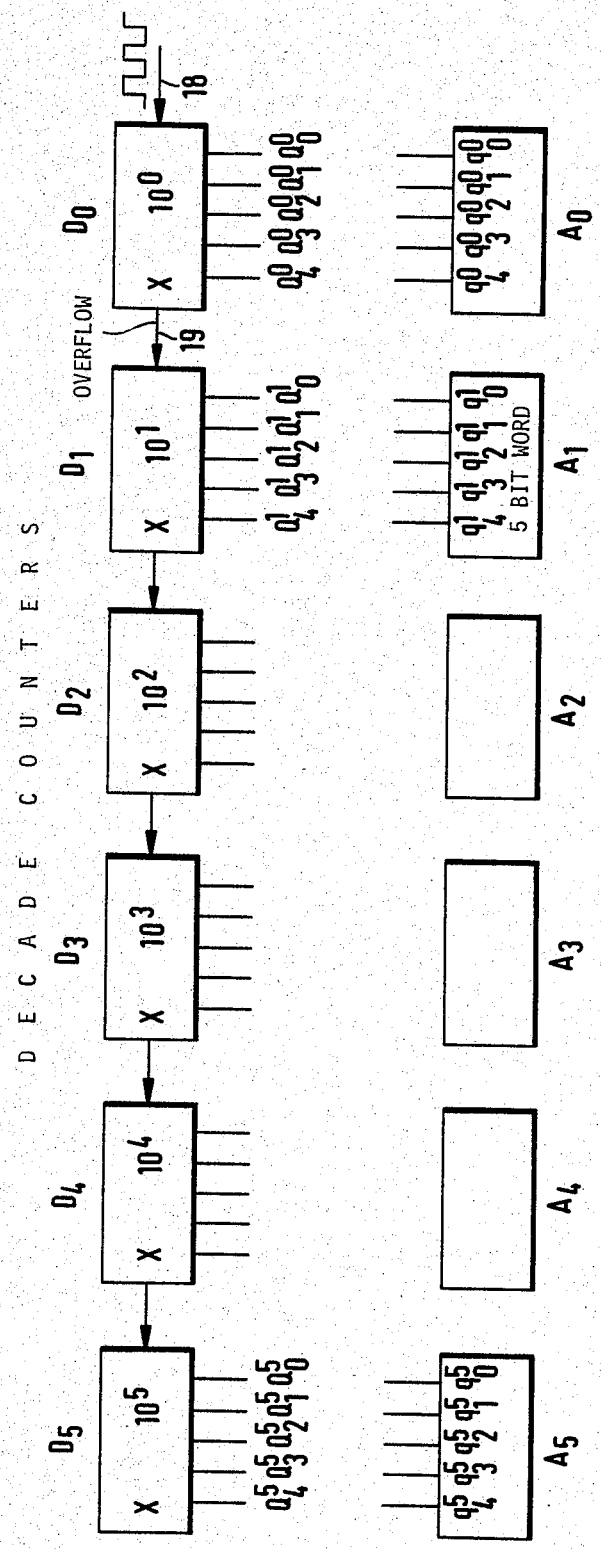
FIG. 3 shows, in block diagram, the association of the storage with the decades of the counter.

In FIGS. 2 and 3, $D_0$, $D_1$, $D_2$, $D_3$, $D_4$, $D_5$ are six decades of a counter. Each decade is developed as a shift counter with five bits. The counting pulse—possibly after reshaping—is fed into the first decade $D_0$ via a line 18. The origin of line 18 is a signal transmitter or a pulse shaping circuit feeding the mentioned counting pulse with a signal having usable shape into said line 18. A carry-over line 19 which connects decade $D_0$ to decade $D_1$ feeds a pulse into the next higher decade $D_1$ when a counting cycle of decade $D_0$ has been completed. In the same way, carry-overs are fed into the decades $D_2$, $D_3$, $D_4$, $D_5$. Each counter has five counter outputs 20 which are designated $Q^0_0$, $Q^0_1$, $Q^0_2$, $Q^0_3$ and $Q^0_4$ in FIG. 3 for the first decade. In corresponding manner, the counter outputs for the second decade $D_1$ are designated bit-wise by $Q^1_0$, $Q^1_1$, etc. up to $Q^5_0$, $Q^5_1$, $Q^5_2$, $Q^5_3$, $Q^5_4$ of the sixth decade $D_5$.

The table of state of FIG. 4 shows how each decade of the six-decade counter 10 counts in a Libaw-Craig counting code:

In the table of state of FIG. 4, Z designates the counting pulses with which the counter states or outputs $Q_0$ to $Q_4$ are bit-wise associated. From the table of state it is clear that upon the occurrence of each counting pulse Z, at most one bit changes from binary state 1 to binary state 0, for instance upon the first counting pulse in the lowermost bit, associated with the output $Q_0$. The change from the binary state 0 to the binary state 1 starting from the sixth counting pulse is of less interest here since no erasing of a storage cell is associated with it but rather the writing of a binary number 1.

The count of the counter of each decade $D_0$ to $D_5$ is stored in a word of a non-volatile storage consisting of floating-gate storage cells. Each word comprises five bits for the storage of a decade word and a sixth additional bit for the securing of the data, which will be explained further below.

In FIG. 2 the non-volatile storage part which is associated with the lowermost five decades and can be addressed by five words is designated 21. The storage part 22 which is associated with the highest decade can be addressed by another address consisting of six bits. In FIG. 3, the storage addresses are designated $A_0$, $A_1$ to $A_5$ and the storage inputs are designated $q^0_0$, $q^0_1$, $q^0_2$, $q^0_3$, $q^0_4$ for the lowermost decade and $q^1_0$, $q^1_1$, $q^1_2$, $q^1_3$, $q^1_4$ for the next higher decade. The representation contained in FIG. 3 of the storage addresses for the decades of the counter is present in this connection for a given time interval, in this case for the first 100,000 km. As explained below, the association is changed as a function of the count of the counter or numerical value every 100,000 km in the case of the lowermost five decades while the association for the uppermost decade $D_5$ with the storage part 22 is retained at all times.

FIG. 5 shows how the association of the addresses j for the storage of the values of the lowermost five decades K=0, 1, 2, 3, 4 is interchanged cyclically as a function of the counting intervals n=0, 1, 2, 3, 4, i.e. every 100,000 km. The storage address for the storage of the sixth decade K=5, on the other hand, always remains equal to j=5.

The function table for the forming of the addresses is realized in FIG. 2 in the coder 23. Accordingly a bus line 24 for the addresses leads to both storage parts 21 and 22. The coder is fed via a bus line 25 with information about the counting interval which is just present, which is taken from the decade $D_5$, since the counting interval is 100,000 km. A further bus line 26 feeds the coder with information as to what value of one of the decades $D_0$ to $D_5$ is to be transferred to the non-volatile storage part 21.

Via a control bus 27 which is acted on by control data in a control logic part 28, the control information is transferred to the address counter 29 feeding the bus line 26, to the coder 23, to the non-volatile storage 21, 22, and to a decade selector 30.

The decade selector 30 is developed as a multiplexer and determines, by signals of the address counter 29 via the bus line 26, the numerical value of what decade is to be transferred in each case into the non-volatile storage. The interrogating of the decades $D_0$ to $D_5$ takes place in this connection from the highest decade to the lowest, i.e. starting from $D_5$.

The functional groups described can be parts of a microprocessor, the functional groups for the securing of the data to be described below.

From FIG. 2 it can furthermore be seen that the control logic part 28 is fed counting pulses via a line 31. Another line 33 is branched off from the bus line 26 and leads only to the storage part 22.

With regard to the development of the non-volatile storage it may furthermore be noted as advantageous that it requires only 35 storage cells for storing the numerical value which covers six decades.

The circuit operates in the manner that counting pulses are fed via the line 18 into the six decadic counters so that their decades $D_0$ to $D_5$ are incremented corresponding to the number of counting pulses fed, and the numerical value is present in the counter as a number coded in the Libaw-Craig code. For the carry-over of the individual decades of the numerical value, the address counter 29 is placed in operation, controlled by the control logic part 28, so that the decades are carried over from $D_5$ to $D_0$ one after the other into the non-volatile storage 21, 22. First of all, the content of the decade $D_5$ is fed into the storage part 22, this being caused by a signal on the line 33, when the address counter has counted the decade K=5. The counter readings of the decades $D_4$ to $D_0$ are then written cyclically in time-division multiplex operation by the decade selector 30 into the storage part 21 of the non-volatile storage, for which purpose the decade selector is controlled by signals in the bus line 26. At the same time, the coder 23, which also contains signals from the bus line 26 corresponding to the decade value to be carried over as well as signals from the bus line 25 concerning the specific counting interval, determines the address of the five-bit word in the storage part 21 under which the content of the decade simultaneously selected by the decade selector is to be stored in the non-volatile storage part 21. This process is repeated until one carry over cycle when the lowest decade $D_0$ is also interrogated. The association of the addresses in the storage part 21 changes, controlled by the address counter 29, every 100,000 km while the association of the address j=5 with the storage part 22 remains unchanged.

For the securing of the data, assurance must be had that, in case of an interruption of the supply of current or a strong drop in voltage during the transfer of a counter reading into the non-volatile storage, sufficient energy is available to complete this process so that no information is lost. The energy required to complete the process and secure the data is taken from a capacitor, not shown in the drawing, which in accordance with the invention has an advantageously small capacity.

For the securing of the data, each storing address of the non-volatile storage is increased by a sixth bit, i.e. each portion of the non-volatile storage accessible by one storage address and comprising five storage cells is amplified by a sixth storage cell for the storing of a complete word. Furthermore, a 1-bit register F is provided which is in communication with the sixth storage cells of all addresses. Furthermore, the control logic part 28 is fed in addition via a line 34 by a signal given off by an operating-voltage monitoring device.

If during a transfer of the numerical value of one decade, for instance of the decade $D_3$, the operating voltage should fail, the transfer of the counter reading of said decade $D_3$ will nevertheless be carried out completely. Thereupon, if the content of the decade $D_3$ had been changed just before the transfer of its contents, then a logical 1 will be recorded in the sixth storage cell under this address. This sixth storage cell, which is normally not acted upon, can be written very rapidly. Due to the voltage failure the contents of the decades $D_2$, $D_1$, $D_0$ are no longer transferred within this transfer cycle. Upon restoration of the operating voltage, however, it is checked whether a sixth storage cell has been set to 1. Since this takes place here in the sixth storage cell, which belongs to the address under which the value of the decade $D_3$ is transferred, the value zero upon restoration of the operating voltage is stored in the storage part 21 under the addresses for the decades $D_2$, $D_1$ and $D_0$. This means that in the event that the sixth storage cell has been set to 1 at the address under which the value of the decade $D_3$ was stored, the counter in decades $D_2$, $D_1$, $D_0$ has made a carry forward up to decade $D_3$ so that the content of the addresses $D_2$, $D_1$, $D_0$ must be zero.

Instead of the method of securing the data which has been described, it is possible, while retaining the addresses of the storage consisting of five bits, to use a buffer capacitor of larger capacity in order to conclude the transfer of the values of all decades in one cycle.

The circuit described makes it possible to store an odometer reading reliably for a long time so that it is possible to use liquid crystal cells for the display, they being characterized by absolute freedom from noise, large height of numbers with shallow depth of installation and easy separation of the indication of the distance traveled from the electronic and speed indications.

FIG. 2 shows the power supply device 36 to which the voltage monitoring device 35 is connected. The output signal of the voltage monitoring device is fed into the control logic part 28 via the line 34. Also connected to the power supply 37 is the buffer capacitor which is adapted to supply sufficient energy to the circuit for effecting the transfer of the numerical value of one decade after failure of the power supply. According to FIG. 2 it is provided that the buffer capacitor feeds the 1-bit register F, the decade selector 30, the storage part 22 and the address counter 29.

FIG. 2 also shows the multiplexing feature of the decade selector 30. This feature is indicated by two switches 30a and 30b. Both switches are actuated by the address counter 29 via the bus line 26, cf. the second paragraph on page 12. The switches 30a and 30b are adapted to connect the outputs 20 of each of the decades $D_0$ to $D_4$ with each of the portions of the storage 21 having the addresses $A_0$ through $A_4$ in a particular sequence, cf. the second paragraph on page 2.

I claim:

1. In a circuit for storing a multi-digit decimal numerical value of the distance traversed by a vehicle having a signal transmitter which gives off electric counting pulses, and particularly an electronic tachometer, particularly adapted for use with an odometer, the improvement wherein said circuit further comprises
   an electronic encoder coding the numerical value in a one-step code whereby the numerical value can be stored; and wherein
   said encoder includes decade counters in which each decade of a counter for the counting of the numerical value is adapted for use with the one-step code; said circuit further comprising
   means for transferring the numerical value coded in the one-step code from said counter to a non-volatile storage formed of floating gate storage cells each having an input; and
   wherein one group each of floating gate storage cells can be addressed for the storage of one-step coded numerical values corresponding to each decade, and wherein
   said means for transferring the numerical value include means which are actuated at predetermined numeral values for cyclically interchanging the addresses of the storage places of the lowest of said decades.

2. The circuit as set forth in claim 1, wherein
   the means for coding the numerical value performs the coding by use of the Libaw-Craig code.

3. The circuit as set forth in claim 1, wherein
   each of the counter outputs of the lowest five of said decades are cyclically connected, via a decade selector developed as a multiplexer, with each of the inputs to said storage being addressable by a single address;
   said circuit further comprising coding means and an address counter which counts successive decades and controls said decade selector as well as a first input of said coding means, a second input thereof being fed by at least one decade of said counter; and wherein
   an address output of the coding means is present for cyclically interchanging the addresses of the lowest five of said decades with the storage.

4. The circuit as set forth in claim 1, further comprising
   means comprising a buffer capacitor in the circuit in order to secure the data in case of the failure of the operating voltage during a writing process for transferring the counter reading into the storage.

5. The circuit as set forth in claim 1, wherein
   each address of the non-volatile storage is incremented by one bit at a time,
   the circuit further comprising a voltage monitoring device, a buffer capacitor and a control logic unit controlled by said voltage monitoring device and being so constructed that, in case of a failure of operating voltage during the transfer of the reading of the counter into the non-volatile storage, the writing process under one address of a decade is carried out to the end by means of said buffer capacitor and thereupon an additional one of said bits is added to the decade, and that upon the next following connection of the operating voltage the contents of the addresses of lower decades of said counter are set at a predetermined number.

6. In an electric circuit for storing numerical data for an odometer in a vehicle, said data being incremented bit by bit corresponding to the distance travelled by said vehicle, said circuit comprising:
  a storage unit operative in response to electric energy from a source thereof, the utilization of said energy being dependent on the number of changes in state of data stored in said storage unit, said storage unit being a non-volatile storage formed of floating gate storage cells;
  means coupled between said storage unit and a source of said data for coding said data with a code wherein the number of said changes in state is minimized between successive values of said data, thereby minimizing said utilization of said energy; and wherein
  said coding means comprises an electronic encoder coding the numerical data in a one-step code, said encoder including decade counters in which each decade of a counter for the counting of the numerical data is adapted for use with the one-step code;
  means for transferring the numerical data coded in the one-step code from said counter to said storage unit; and wherein
  one group each of floating gate storage cells can be addressed for the storage of one-step coded numerical data corresponding to each decade; and wherein
  said means for transferring the numerical data include means which are actuated at predetermined numerical values for cyclically interchanging the addresses of the storage places of the lowest of said decades.

7. The circuit according to claim 6, wherein
  said coding is accomplished with a Libaw-Craig code.

8. The circuit according to claim 6, further comprising
  means comprising a capacitor for storing further energy for the operation of said storage unit, and said further energy maintaining operation of said circuit during a transistion in said data between successive values thereof, thereby preventing a loss of data in the event of a failure of said energy source.

* * * * *